United States Patent
Yasuda et al.

(10) Patent No.: US 6,853,057 B2
(45) Date of Patent: Feb. 8, 2005

(54) LEAD FRAME FOR A PLASTIC ENCAPSULATED SEMICONDUCTOR DEVICE

(75) Inventors: Yoshiki Yasuda, Kitakatsuragi-gun (JP); Hideya Takakura, Kitakatsuragi-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/340,644

(22) Filed: Jan. 13, 2003

(65) Prior Publication Data

US 2003/0132512 A1 Jul. 17, 2003

(30) Foreign Application Priority Data

Jan. 15, 2002 (JP) ........................................ 2002-006410

(51) Int. Cl.[7] ........................ H01L 23/495; H01L 23/48
(52) U.S. Cl. ........................ 257/666; 257/671; 257/672; 257/676
(58) Field of Search ................................ 257/666, 670, 257/671, 672, 676, 696

(56) References Cited

U.S. PATENT DOCUMENTS

| | | | | |
|---|---|---|---|---|
| 4,026,008 A | * | 5/1977 | Drees et al. | 29/593 |
| 5,285,104 A | * | 2/1994 | Kondo et al. | 257/666 |
| 5,422,314 A | * | 6/1995 | Sekiba | 29/827 |
| 5,665,983 A | * | 9/1997 | Nagano | 257/81 |
| 5,821,610 A | * | 10/1998 | Nishikawa | 257/670 |
| 6,335,223 B1 | * | 1/2002 | Takada et al. | 438/111 |
| 6,355,502 B1 | * | 3/2002 | Kang et al. | 438/110 |
| 6,507,035 B1 | * | 1/2003 | Hasegawa et al. | 250/551 |
| 6,521,987 B1 | * | 2/2003 | Glenn et al. | 257/684 |
| 6,551,858 B2 | * | 4/2003 | Kawata et al. | 438/109 |
| 6,713,322 B2 | * | 3/2004 | Lee | 438/123 |
| 2003/0080404 A1 | * | 5/2003 | Tajina et al. | 257/687 |
| 2003/0134452 A1 | * | 7/2003 | Mazzola et al. | 438/112 |

FOREIGN PATENT DOCUMENTS

| | | | |
|---|---|---|---|
| JP | 63-115355 | * | 5/1988 |
| JP | 7-221245 A | | 8/1995 |
| JP | 8-204101 A | | 8/1996 |
| JP | 2000-58733 | * | 2/2000 |

* cited by examiner

Primary Examiner—Alexander Oscar Williams
(74) Attorney, Agent, or Firm—Birch, Stewart, Kolasch & Birch, LLP (57) ABSTRACT

In a lead frame which has second tie bars in the vicinity of plastic packages first notches are formed along first edges of the second tie bars (in areas defined on both sides of the inner leads and to come into contact with a punch during the tie bar cutting step). The first notches prevent troubles associated with close arrangement of the second tie bars and the plastic packages. In addition, second notches are provided along second edges of the second tie bars. These second notches are designed to receive the tips of outer leads which extend from neighboring plastic packages of the lead frames.

5 Claims, 8 Drawing Sheets

LEAD FRAME FOR A PLASTIC ENCAPSULATED SEMICONDUCTOR DEVICE

BACKGROUND OF THE INVENTION

1. Field of the Invention

The present invention relates to a lead frame to be used for fabrication of a plastic-encapsulated semiconductor device, more particularly to a lead frame for a semiconductor device and a photocoupler which are made by transfer molding.

2. Related Art

In general, the fabrication process of a plastic-encapsulated semiconductor device comprises the step of attaching a chip on a lead frame, the step of electrically interconnecting the attached chip to leads by wire bonding, the step of encapsulating the wire-bonded chip in plastic by transfer molding, and the step of cutting tie bars. One of the functions of these tie bars is to prevent resin bleed during the transfer molding step.

In the tie bar cutting step, while the lead frame is pressed and fixed by a tie bar cutting die, the tie bars and thick flashes (resin masses which accumulate in gaps between the plastic package and the tie bars) are punched out by a punch (see for example Japanese Patent Laid-open Publication No. H7-221245)

This tie bar cutting operation needs to allow for the influence of cracking or the like on the molded package (hereinafter called plastic package), wear of the punch, and any other factors. Hence, the tie bars should be spaced from the plastic package by 0.15 mm to 0.2 mm or greater, in order to make up for misalignment and margins of the molding die. Such clearances permit the punch to sever the tie bars.

In the transfer molding step, plastic is filled into a molding die which is closed on the lead frame. As known, where the plastic package and the tie bars are spaced by a greater clearance, the clamping pressure at the surface of the molding die gets lower. To prevent resin from bleeding beyond the tie bars, high pressure (generally, as high as several hundred tons) has to be applied to the molding die.

If a photocoupler is made by double transfer molding, two rows of tie bars are necessary, as first tie bars for the primary molding operation and second tie bars for the secondary molding operation. The first and second tie bars are cut after the respective molding operations, which naturally necessitate equipment and clearances for the two cutting operations.

Figure 9:
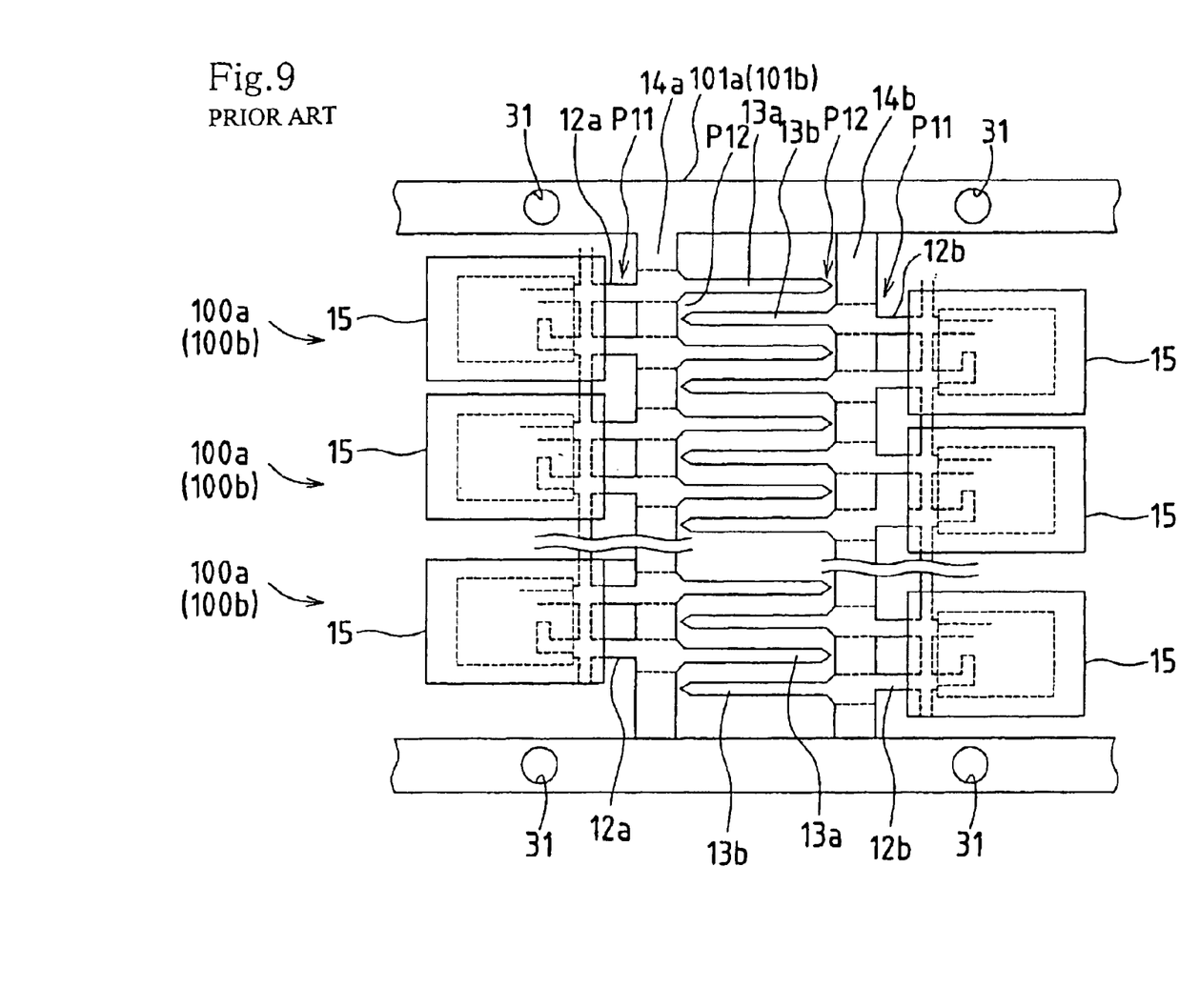
FIG. 9 is a plan view which shows the structure of conventional photocouplers obtained by double transfer molding, at the end of the molding step.
Figure 10:
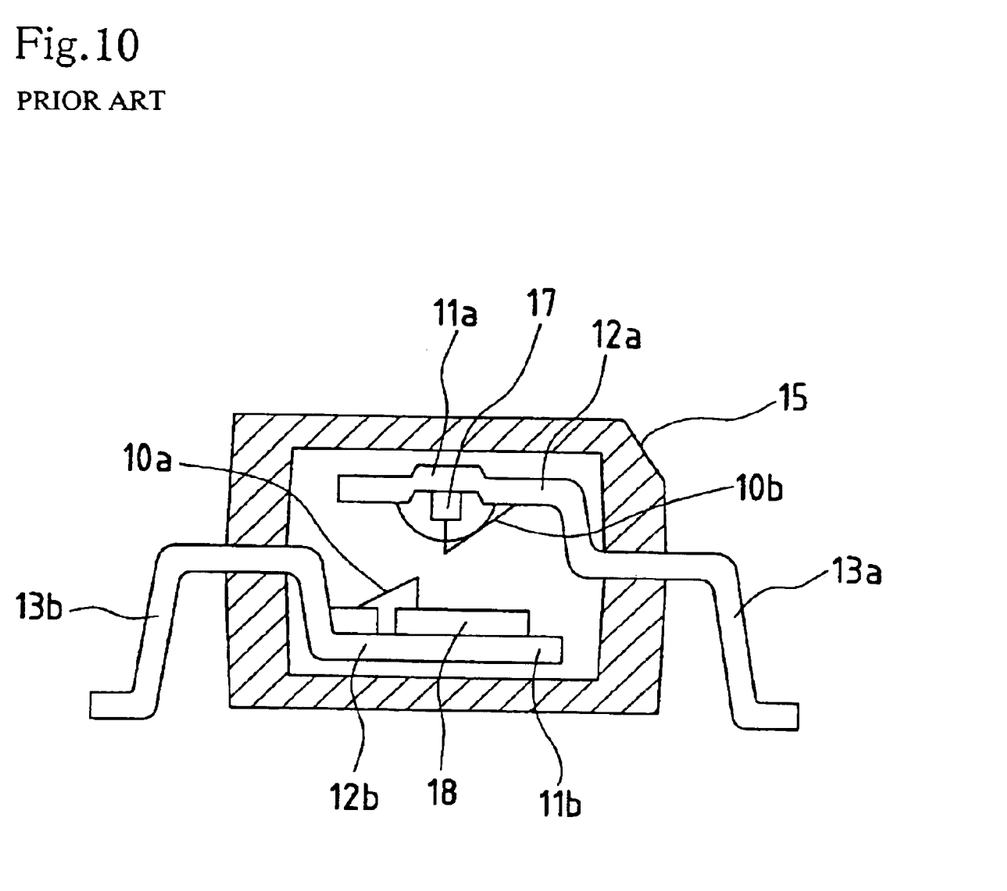
FIG. 10 is a vertical section view which shows the structure (typical structure) of a finished face-to-face type photocoupler.

FIG. 9 is a plan view which shows the structure of conventional photocouplers, after the molding step in the double transfer molding technique. FIG. 10 is a vertical section view which shows the structure (typical structure) of a finished face-to-face type photocoupler.

The photocoupler has a pair of lead frames (an emitter-side lead frame 100a and a detector-side lead frame 100b) which comprise frame headers 11a, 11b which respectively mounts a light-emitting element 17 and a light-detecting element 18 (not shown in FIG. 9) a plurality of inner leads 12a, 12b which are arranged in the periphery of these frame headers at a predetermined interval, a plurality of outer leads 13a, 13b which correspond to the inner leads 12a, 12b, and tie bars 14a, 14b which connect the inner leads 12a, 12b and the outer leads 13a, 13b. The pair of lead frames 100a, 100b are matched such that the light-emitting element 17 is vertically face to face with the light-detecting element 18. As shown in FIG. 9, a plurality of such pairs are connected together via a frame rail unit composed of emitter-side frame rails 101a and detector-side frame rails 101b. The frame headers 11a, 11b and the inner leads 12a, 12b which are arranged in their periphery are encapsulated in plastic to form a plastic package 15.

Additionally, numerals 31 in FIG. 9 indicate reference holes to be relied on when the frame rails 101a, 101b are matched or placed into a mold.

As a traditional requirement, sufficient clearances P11 (0.15 mm to 0.2 mm or greater) are secured between the plastic packages 15 and the tie bars 14a, 14b, allowing for the influence of cracking or the like, wear of the punch, and any other factors which may be anticipated when the tie bars 14a, 14b are cut off by a punch.

According to this structure, when the emitter-side lead frames 100a and the detector-side lead frames 100b are vertically matched on one another, the light-emitting elements 17 are opposed to the light-detecting elements 18. In the structure illustrated in FIG. 9, the outer leads 13a of the emitter-side lead frames 100a and the outer leads 13b of the detector-side lead frames 100b are arranged to alternate in the horizontal direction without overlapping each other. Moreover, to improve the mounting density, the outer leads 13a, 13b are staggered.

As another traditional requirement, anti-interference clearances P12 are secured between the tips of the outer leads 13a, 13b and the tie bars 14b, 14a which face the outer leads 13a, 13b, respectively.

Thus, when the tie bars and thick flashes are punched out by a punch after the molding step according to the conventional transfer molding technique, sufficient clearances P11 are indispensable between the plastic packages 15 and the tie bars 14a, 14b for the purpose of eliminating the influence of cracking or the like on the plastic package. It is also essential to leave anti-interference clearances P12 between the tips of the outer leads 13a, 13b and the opposed tie bars 14b, 14a. Such clearances hamper improvement of the mounting density of lead frames and thus limit the number of photocouplers per frame rail unit. However, a simple attempt to locate the tie bars closer to the plastic package will create other problems. For example, errors due to misalignment of the molding die or wear of the punch disable the tie bar cutting operation, or leave noticeable burrs on the tie bars.

There is still another problem relating to transfer molding. To avoid resin bleed or the like in the situation where plastic is filled into a molding die which is closed on the lead frame, high pressure is applied to the molding die by means of a high-pressure press. Nevertheless, the high-pressure press is so expensive as to boost the equipment cost and the production cost.

SUMMARY OF THE INVENTION

The present invention is made to solve these problems. An object of the present invention is to provide a lead frame for a semiconductor device in which at least one tie bar is shaped in such a manner as to enable closer arrangement of the tie bar and a plastic package, and which enables fabrication of semiconductor devices with the use of a low-pressure press without fear of resin bleed.

A lead frame for a semiconductor device according to the present invention comprises: a semiconductor chip attachment part; a plurality of inner leads which are arranged in the periphery of the semiconductor chip attachment part at a predetermined interval; a plurality of outer leads which correspond to the inner leads; and at least one tie bar which connects the inner leads and the outer leads. Provided that the lead frame is encapsulated in plastic to give a molded package, the tie bar is formed to locate in the vicinity of the molded package (plastic package) with a clearance of from 0.07 mm to 0.1 mm. In this lead frame, the tie bar has a first edge which faces the molded package and also has a punching area which comes into contact with a punch during a tie bar cutting step, and the punching area includes first notches formed along the first edge.

Owing to these features of the present invention, the first notches formed in the tie bar enable the cutting operation of the tie bar which is formed closer to the plastic package. Then, the close arrangement of the tie bar and the plastic package can improve the mounting density of the lead frames. Moreover, where the tie bar locates close to the plastic package, the clamp pressure of the molding die can be reduced. As a result, manufacturers can utilize an inexpensive press with low press capacity, thereby to reduce the production cost.

Concerning the lead frame of this invention, the tie bar has a second edge which does not face the molded package, and includes second notches which are formed along the second edge and designed to receive tips of outer leads which extend from a neighboring molded package. Since the second notches dispense with traditional clearances (clearances P12 in FIG. 9) between the tips of the leads and the second edge of the tie bar, it is possible to improve the mounting density of the lead frames.

In the above structure, the first and second notches may have a semicircular shape in plan view. The rounded notches help to reduce wear of a punch in a lead frame stamping die.

Further, with respect to the tie bar having a punching area which comes into contact with a punch during the tie bar cutting step, the punching area may additionally include V-shaped grooves whose depth is parallel to a punching direction. These V-shaped grooves further serve to decrease burrs or to reduce wear of a punch due to the tie bar cutting operation.

Instead of the V-shaped grooves, the punching area may additionally include coined portions whose thickness is less than that of the outer leads. The coined portions can also serve to decrease burrs or to reduce wear of a punch due to the tie bar cutting operation.

Furthermore, the at least one tie bar related to the molded package may be integrally connected with tips of outer leads which extend from a neighboring molded package. In comparison with the opposed structure where a top lead frame is placed on a bottom lead frame, the flat structure can improve the mounting density of the lead frames.

Additionally, with regard to the double tie bar structure, the characteristic tie bar structure as above is applicable to whichever of a tie bar for a primary molding operation and a tie bar for a secondary molding operation.

DESCRIPTION OF THE PREFERRED EMBODIMENTS

Embodiments of the present invention are described below with reference to the drawings.

Embodiment 1

Figure 1:
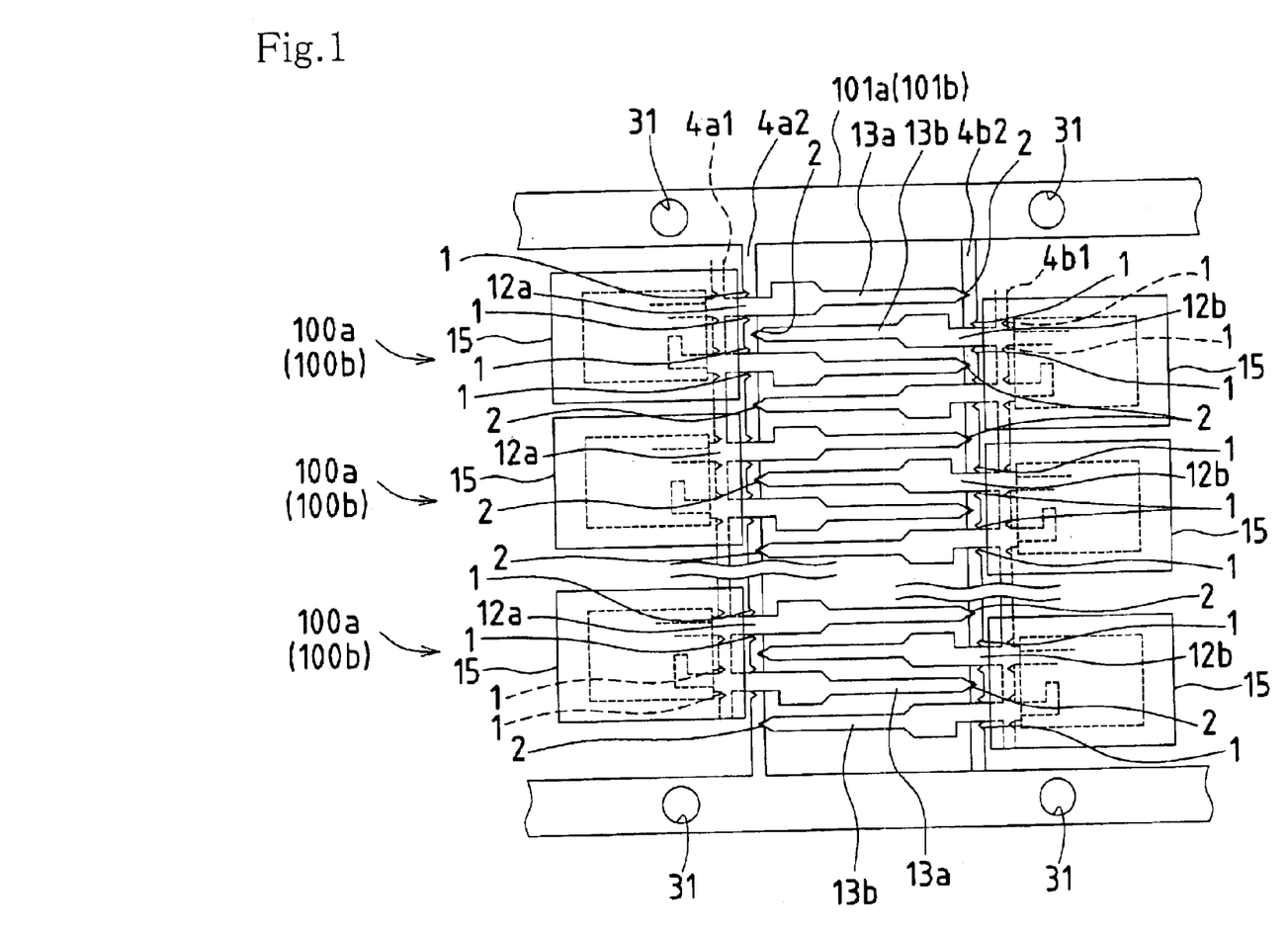
FIG. 1 is a plan view showing lead frames for semiconductor devices according to Embodiment 1 of the present invention, with the emitter-side lead frames and the detector-side lead frames being matched.
Figure 2A:
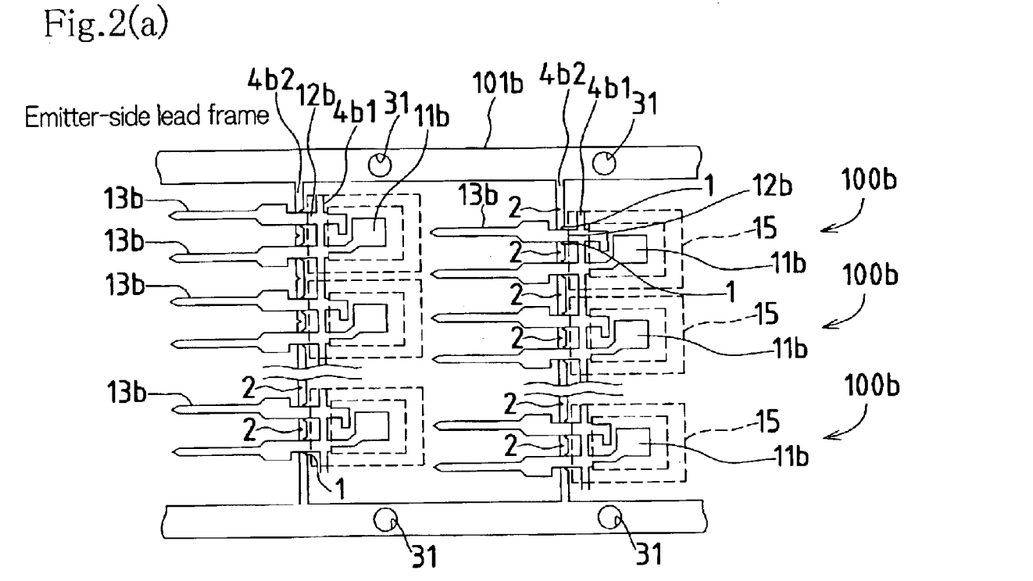
FIG. 2(a) is a plan view of the emitter-side lead frames.
Figure 2B:
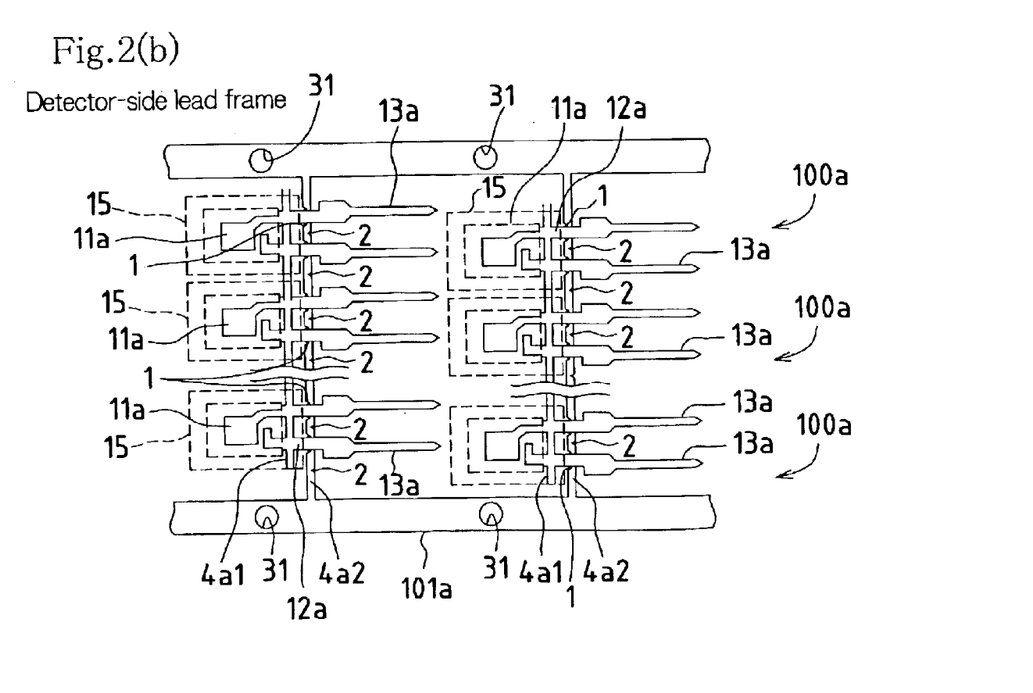
FIG. 2(b) is a plan view of the detector-side lead frames.

FIG. 1 and FIG. 2 are plan views showing lead frames for semiconductor devices according to Embodiment 1 of the present invention. FIG. 1 shows the emitter-side lead frames and the detector-side lead frames which are matched together. FIGS. 2(a), (b) depict the detector-side lead frames and the emitter-side lead frames separately.

A face-to-face type photocoupler can be fabricated by the same double transfer molding technique as conventionally known and described with reference to FIG. 10. Also, the structure of the photocoupler is identical to the one illustrated in FIG. 9. Therefore, like elements are hereinafter indicated by like numerals as used in FIG. 9 and FIG. 10.

Following is a brief description of the method of fabricating a face-to-face type photocoupler by double transfer molding.

To start with, the light-emitting element 17 and the light-detecting element 18 (see FIG. 9) are respectively attached to the frame header 11a of the emitter-side lead frame 100a and to the frame header 11b of the detector-side lead frame 100b, via Ag paste or the like. These elements are then wire-bonded to the leads by means of wires 10a, 10b (see FIG. 10). Next, with the light-emitting element 17 being precoated or treated otherwise, the lead frames 100a, 100b are arranged in a vertically opposed manner and subjected to a primary transfer molding operation with the use of light-transmissive plastic. After the primary molding, first tie bars 4a1, 4b1 are cut off. In FIG. 1, however, the first tie bars 4a1, 4b1 are outlined by broken lines as if they were not cut off.

Similar to the common practice, the tie bar cutting step is conducted with the use of a tie bar cutting die (not shown). With the lead frames 100a, 100b being pressed and fixed in the cutting die, the first tie bars 4a1, 4b1 and thick resin flashes are punched out by a punch (not shown). Thereafter, the plastic package 15 is formed by a secondary transfer molding operation which is similar to the previous molding operation. The secondary molding is followed by severing of the second tie bars 4a2, 4b2 and forming.

Although the explanation of Embodiment 1 mainly focuses on the second tie bars 4a2, 4b2, it goes without saying that this embodiment applies to the first tie bars 4a1, 4b1 as well.

Referring to FIG. 1, the second tie bars 4a2, 4b2 are provided in the vicinity of the plastic packages 15. Allowing for misalignment and margins of the molding die (not shown), Embodiment 1 arranges the second tie bars 4a2, 4b2 as close as about 0.07 mm to 0.1 mm to the plastic packages 15. Thus, while the conventional structure in FIG. 9 needs clearances P11 ranging from 0.15 mm to 0.2 mm, the clearances in Embodiment 1 are approximately halved to as little as from 0.07 mm to 0.1 mm. As a result, it is possible to improve the mounting density of the emitter-side lead frames 100a and the detector-side lead frames Nevertheless, such a close arrangement of the second tie bars 4a2, 4b2 and the plastic packages 15 may cause a trouble during the tie bar cutting step. Hence, as a preventive measure, the second tie bars 4a2, 4b2 are provided with first notches 1 along their first edges which face the plastic packages 15. To be specific, the first notches 1 formed along the first edges are located at punching areas which come into contact with the punch during the tie bar cutting step (i.e. on both sides of the inner leads 12a, 12b).

The outer leads 13a of the emitter-side lead frames 100a and the outer leads 13b of the detector-side lead frames 100b are arranged to alternate in the horizontal direction without overlapping each other. Moreover, the outer leads 13a, 13b are staggered.

Concerning this staggered arrangement of Embodiment 1, the second tie bar 4a2 is provided with second notches 2 along its second edge which does not face the plastic packages 15. These second notches 2 are designed to receive the tips of the outer leads 13b which extend from neighboring plastic packages 15 of the detector-side lead frames 100b. Similarly, the second tie bar 4b2 is provided with second notches 2 along its second edge which does not face the plastic packages 15. The second notches 2 are designed to receive the tips of the outer leads 13a which extend from neighboring plastic packages 15 of the emitter-side lead frames 100a.

The arrangement of the second notches can dispense with the clearances P12 shown in FIG. 9 and result in further improvement of the mounting density of both the emitter-side lead frames 100a and the detector-side lead frames 100b. Besides, this structure can increase the number of photocouplers to be obtained in the unit composed of the frame rails 101a, 101b. Eventually, it is possible to reduce the production cost.

Figure 3:
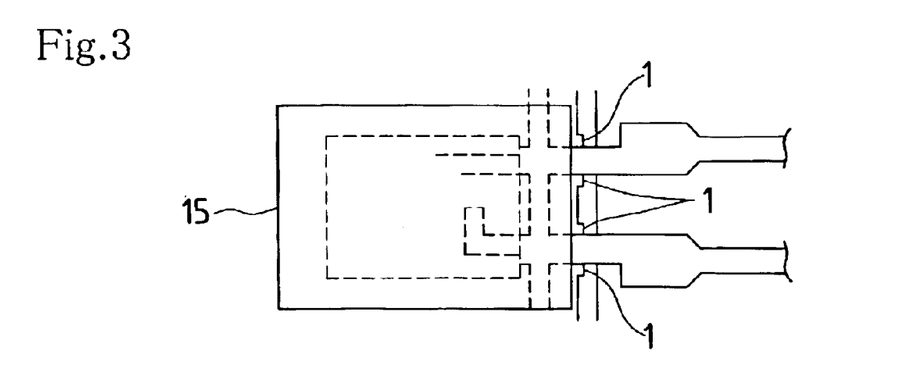
FIG. 3 is an enlarged partial plan view showing an example of the notch shape for the first notches.
Figure 4:
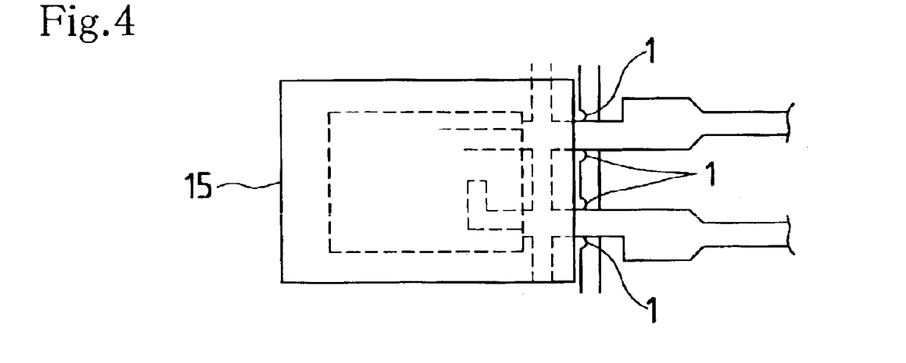
FIG. 4 is an enlarged partial plan view showing another example of the notch shape for the first notches.
Figure 5:
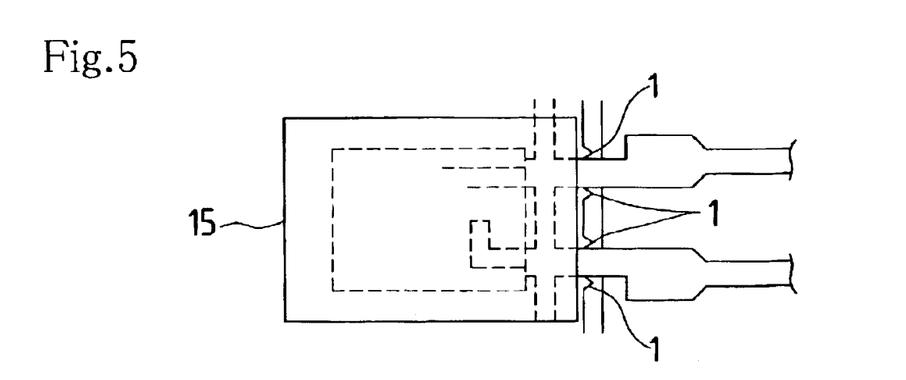
FIG. 5 is an enlarged partial plan view showing another different example of the notch shape for the first notches.

FIG. 3 to FIG. 5 exemplify the shapes of the first notches 1. Seen in plan view, the notches in FIG. 3 have a square shape, those in FIG. 4 have a semicircular shape, and those in FIG. 5 have a triangular (V-shaped) shape. Among them, in the case where the first notches 1 are semicircular in plan view (see FIG. 4), the rounded configuration can reduce wear of a punch in a lead frame stamping die.

While Embodiment 1 is directed to the fabrication method of a face-to-face type photocoupler, Embodiment 2 deals with a flat type photocoupler.

Embodiment 2

Figure 6:
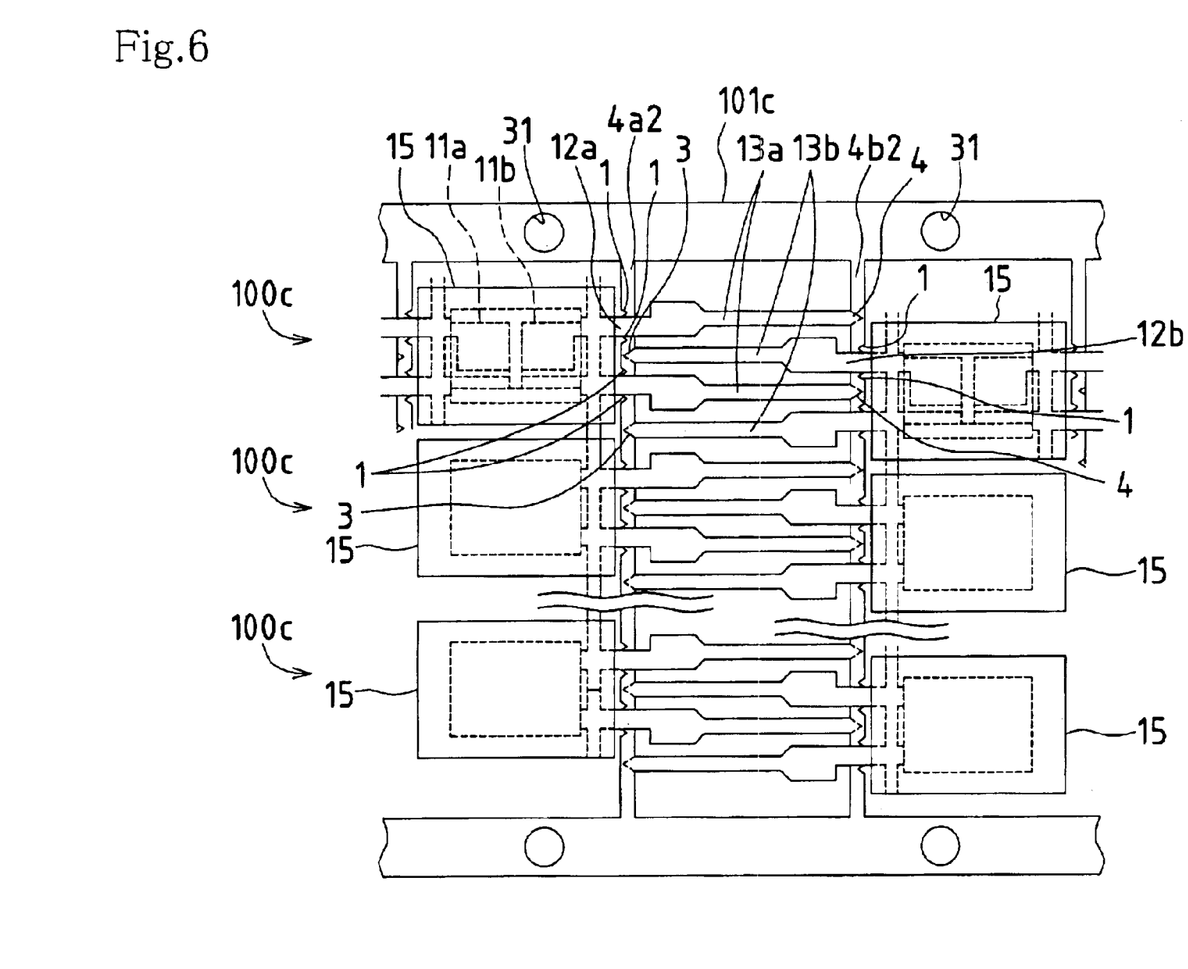
FIG. 6 is a plan view showing lead frames for semiconductor devices according to Embodiment 2 of the present invention, after flat type photocouplers go through the secondary transfer molding operation.

FIG. 6 shows a flat type photocoupler after the secondary transfer molding operation.

Similar to the face-to-face type photocoupler of Embodiment 1, the flat type photocoupler is provided with the second tie bars 4a2, 4b2 in the vicinity of the plastic packages 15. Because such a close arrangement of the second tie bars 4a2, 4b2 and the plastic packages 15 may cause a trouble during the tie bar cutting step, the second tie bars 4a2, 4b2 are provided with first notches 1 along their first edges which face the plastic packages 15, as a preventive measure. To be specific, the first notches 1 formed along the first edges are located at punching areas which come into contact with the punch during the tie bar cutting step (i.e. on both sides of the inner leads 12a, 12b).

The flat type photocoupler of this structure is basically fabricated in the same manner as the face-to-face type photocoupler. To mention the principal difference, which concerns the manner of signal transmission, a light-detecting element and a light-emitting element for the flat type photocoupler are attached to the same (single) lead frame 100c.

Unlike the face-to-face type counterpart, the flat type photocoupler does not need to bend headers or to dispose two lead frames in a vertically opposed relationship. On the other hand, absence of the opposed relationship is detrimental to detection sensitivity and causes serious fluctuation of transmission efficiency. From a different point of view, the flat layout limits the size of the frame headers 11a, 11b.

In this regard, the distinctive arrangement of Embodiment 2 is illustrated in FIG. 6. With respect to the second tie bar 4a2, its second edge which does not face the plastic packages 15 is integrally connected with the tips of the outer leads 13b which extend from neighboring plastic packages 15 (the integration points are indicated by numerals 3 in FIG. 6). Similarly, with respect to the second tie bar 4b2, its second edge which does not face the plastic packages 15 is integrally connected with the tips of the outer leads 13a which extend from neighboring plastic packages 15 (the integration points are indicated by numerals 4 in FIG. 6).

The integration of the second tie bars 4a2, 4b2 and the outer leads 13b, 13a which extend from neighboring plastic packages 15 can improve the mounting density of the lead frames 100c. In other words, this structure can increase the number of photocouplers obtained per frame rail. Eventually, it is possible to reduce the production cost.

Embodiment 3

Figure 7A:
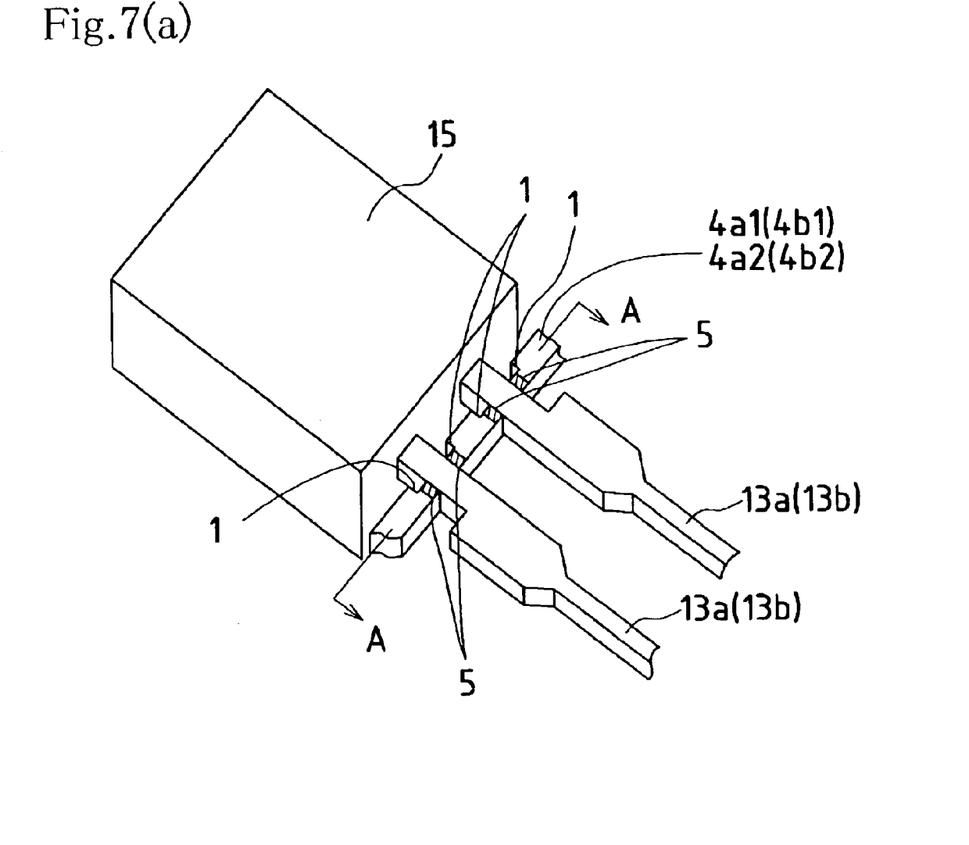
FIG. 7(a) is an enlarged partial perspective view which represents a modification example concerning the areas around the first notches which are described in Embodiment 1 and Embodiment 2.
Figure 7B:
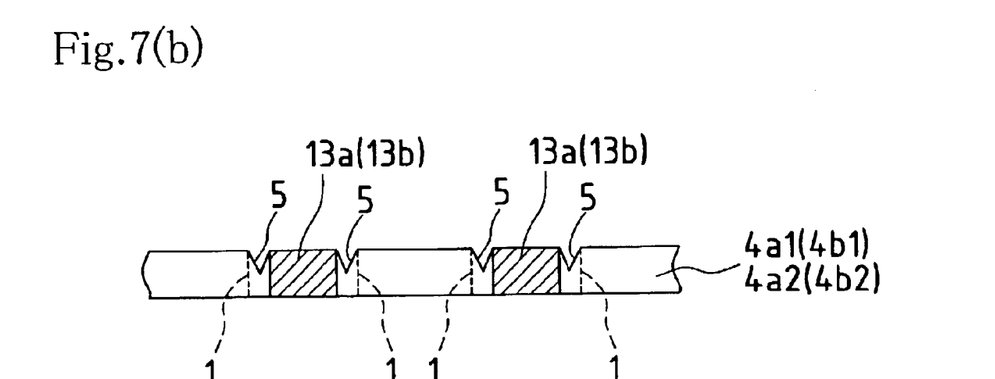
FIG. 7(b) is an enlarged section view taken along Line A—A.
Figure 8A:
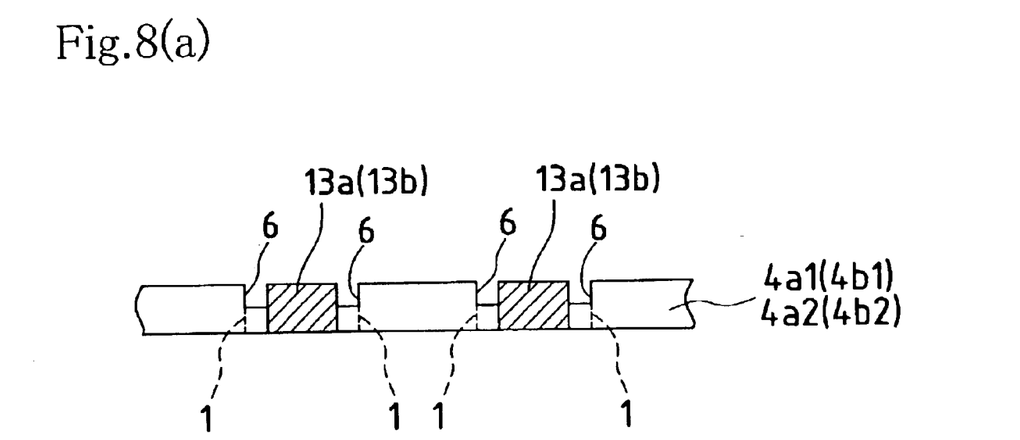
FIGS. 8(a), (b) are partial section views which represent other modification examples concerning the areas around the first notches which are described in Embodiment 1 and Embodiment 2.
Figure 8B:
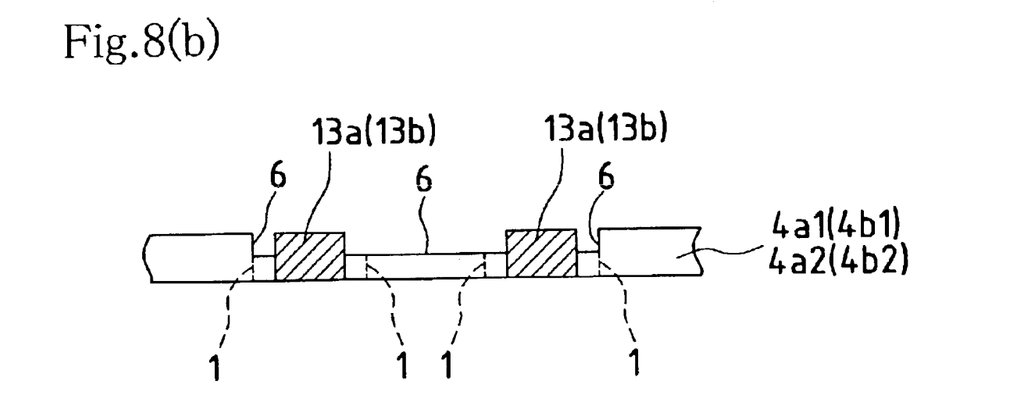

FIG. 7 and FIG. 8 show modification examples concerning the areas around the first notches 1 which are described in Embodiment 1 and Embodiment 2.

Specifically, FIG. 7 depicts punching areas of the tie bar (the first tie bars 4a1, 4b1 and second tie bars 4a2, 4b2 in Embodiment 1 and Embodiment 2) which comes into contact with the punch during the tie bar cutting step. The punching areas include V-shaped grooves 5 which are formed in the flat surface areas of the tie bar and which correspond to virtual extensions of the first notches 1 along the outer leads 13a (13b), with the depth of the grooves parallel to a punching direction.

These V-shaped grooves further serve to decrease burrs or to reduce wear of a punch due to the tie bar cutting operation.

Alternatively, FIG. 8 depicts punching areas of the tie bar (the first tie bars 4a1, 4b1 and second tie bars 4a2, 4b2 in Embodiment 1 and Embodiment 2) which comes into contact with the punch during the tie bar cutting step. The punching areas include coined portions 6 which are formed in the flat surfaces defined on the tie bar and which correspond to virtual extensions of the first notches 1 along the outer leads 13a (13b), with the thickness of the coined portions less than that of the outer leads. The portion to be coined may be limited to the areas which correspond to virtual extensions of the first notches 1 along the outer leads 13a (13b) (see FIG. 8(a)), or may occupy the entire area between the adjacent outer leads 13a (13b) (see FIG. 8(b)).

Coining of the tie bars also serves to decrease burrs or to reduce wear of a punch due to the tie bar cutting operation.

The invention may be embodied in other specific forms without departing from the spirit or essential characteristics thereof. The above embodiments are therefore to be considered in all respects as illustrative and not restrictive, the scope of the invention being indicated by the appended claims rather than by the foregoing description. All changes which come within the meaning and range of equivalency of the claims are therefore intended to be embraced therein.

This application is based on Patent Application No. 2002-006410 filed in Japan, the contents of which are incorporated hereinto by reference. Likewise, the contents of the references cited herein are incorporated hereinto by reference.

What is claimed is:

1. A lead frame for a semiconductor device which comprises:

a semiconductor chip attachment part;

a plurality of inner leads which are arranged in the periphery of the semiconductor chip attachment part at a predetermined interval;

a plurality of outer leads which correspond to the inner leads; and at least one tie bar which connects the inner leads and the outer leads, wherein, the lead frame is encapsulated in plastic to give a molded package, the tie bar is formed so as to be located in the vicinity of the molded package with a clearance of from 0.07 mm to 0.1 mm.

2. The lead frame for a semiconductor device according to claim 1, wherein the tie bar has a first edge which faces the molded package and which is effective to come into contact with a punch during a tie bar cutting step, and the punching area includes first notches formed along the first edge.

3. The lead frame for a semiconductor device according to claim 2, wherein the first notches are semicircular.

4. The lead frame according to claim 1, wherein there are two tie bars both having notches along their edges.

5. The lead frame according to claim 4, wherein the notches are semicircular.

* * * * *